(12) United States Patent
Herrler et al.

(10) Patent No.: US 12,265,144 B2
(45) Date of Patent: Apr. 1, 2025

(54) METHOD FOR EXCITING NUCLEAR SPINS

(71) Applicant: Siemens Healthineers AG, Forchheim (DE)

(72) Inventors: Jürgen Herrler, Erlangen (DE); Patrick Liebig, Erlangen (DE); Rene Gumbrecht, Herzogenaurach (DE); Armin Nagel, Bubenreuth (DE)

(73) Assignee: Siemens Healthineers AG, Forchheim (DE)

( * ) Notice: Subject to any disclaimer, the term of this patent is extended or adjusted under 35 U.S.C. 154(b) by 153 days.

(21) Appl. No.: 18/103,085

(22) Filed: Jan. 30, 2023

(65) Prior Publication Data

US 2023/0251337 A1 Aug. 10, 2023

(30) Foreign Application Priority Data

Feb. 7, 2022 (DE) ...................... 10 2022 201 236.4

(51) Int. Cl.
*G01V 3/00* (2006.01)
*G01R 33/48* (2006.01)
(Continued)

(52) U.S. Cl.
CPC ....... *G01R 33/543* (2013.01); *G01R 33/4822* (2013.01); *G01R 33/5605* (2013.01)

(58) Field of Classification Search
CPC .............. G01R 33/3415; G01R 33/543; G01R 33/5659; G01R 33/36; A61B 5/055
(Continued)

(56) References Cited

U.S. PATENT DOCUMENTS

2010/0260397 A1* 10/2010 Block ................ G01R 33/4828
324/307
2012/0197106 A1    8/2012 Cloos et al.
(Continued)

FOREIGN PATENT DOCUMENTS

| CN | 110543837 A | * 12/2019 | ......... G06K 9/00624 |
|----|-------------|-----------|------------------------|
| EP | 2296000 A1  |   3/2011  |                        |
| EP | 3809151 A1  |   4/2021  |                        |

OTHER PUBLICATIONS

Cloos, M. A., et al. "kT-points: short three-dimensional tailored RF pulses for flip-angle homogenization over an extended volume." Magnetic Resonance in Medicine 67.1 (2012): 72-80.
(Continued)

*Primary Examiner* — Walter L Lindsay, Jr.
*Assistant Examiner* — Frederick Wenderoth
(74) *Attorney, Agent, or Firm* — Lempia Summerfield Katz LLC

(57) ABSTRACT

Nuclear spins are excited in a region of interest in an object under examination by a radio-frequency pulse. During at least one phase of the radio-frequency pulse, excitation fields are transmitted while magnetic field gradients are simultaneously applied so that the magnetization of the nuclear spins moves on a trajectory through a transmission k-space. In a first phase of the at least one phase of the radio-frequency pulse, the trajectory moves at a radial distance around the center of the transmission k-space. The radial distance corresponds to the radius of a sphere superimposed with at least one radial harmonic.

15 Claims, 7 Drawing Sheets

(51) Int. Cl.
  *G01R 33/54* (2006.01)
  *G01R 33/56* (2006.01)
(58) Field of Classification Search
  USPC .......................................................... 324/307
  See application file for complete search history.

(56) References Cited

U.S. PATENT DOCUMENTS

| | | | |
|---|---|---|---|
| 2013/0082704 A1* | 4/2013 | Grodzki | A61B 5/055 |
| | | | 324/309 |
| 2015/0323623 A1* | 11/2015 | Adalsteinsson | G01R 33/5612 |
| | | | 324/322 |
| 2021/0093222 A1 | 4/2021 | Dispenza et al. | |
| 2021/0109178 A1 | 4/2021 | Gumbrecht et al. | |

OTHER PUBLICATIONS

Herrler, Jürgen, et al. "Fast online-customized (FOCUS) parallel transmission pulses: a combination of universal pulses and individual optimization." Magnetic resonance in medicine 85.6 (2021): 3140-3153.

Malik, Shaihan J., et al. "Tailored excitation in 3D with spiral nonselective (SPINS) RF pulses." Magnetic resonance in medicine 67.5 (2012): 1303-1315.

* cited by examiner

METHOD FOR EXCITING NUCLEAR SPINS

RELATED APPLICATION

This application claims the benefit of German Application DE 10 2022 201 236.4, filed on Feb. 7, 2022, which is hereby incorporated by reference in its entirety

FIELD

The embodiments relate to a method for exciting nuclear spins in a region of interest in an object under examination by a radio-frequency pulse, in particular in the context of a magnetic resonance examination, a computer program, a non-transitory computer-readable data carrier, and a magnetic resonance device.

BACKGROUND

Magnetic resonance (MR) and, in particular, the use of MR for imaging, magnetic resonance tomography (MRT), has become an indispensable part of clinical practice. To achieve a maximum signal-to-noise ratio (SNR) and/or the shortest possible examination times, MR devices are being increasingly operated at high field strengths $B_0$ of the static magnetic field. For example, ultrahigh field magnetic resonance tomography (UHF MRT) uses high static magnetic fields of approximately $B_0=7$ tesla. Since the Larmor frequency GL increases linearly with the static magnetic field ($\omega_L=YB_0$, wherein Y is the gyromagnetic ratio), the frequency of the radio-frequency excitation pulses (also called RF pulses) with which the nuclear spins are excited in the body in order to generate the MR signal also increases with increasing $B_0$ fields. The excitation field of the RF pulses is also called the $B_1$ field. The $B_1$ field is typically generated by RF transmit coils.

At 7 tesla, the Larmor frequency of hydrogen nuclei, which are typically used for clinical MRT, is 300 MHz, for example. Hence, radio-frequency (RF) excitation also occurs at 300 MHz, and, at such high frequencies, a standing electromagnetic wave is produced with a very small wavelength in human tissue, approximately 12-13 cm. Together with increasing tissue conductivities and reflections at interfaces between different biological tissues and/or air, a very inhomogeneous $B_1$ excitation field is produced. Furthermore, at high field strengths, the static $B_0$ field inhomogeneities can cause strong absolute differences in the Larmor frequency between different regions of the human body, for example the head.

Hence, with normal RF excitation pulses, hardly any signal is generated in some regions—for example the standing wave nodes. Therefore, in MR imaging of the skull, for example, the lower regions of the head are often very poorly illuminated.

However, for many diagnostic issues, it is extremely disadvantageous not to be able to designate a homogeneous RF excitation field and hence also a uniform flip angle for a specific region of interest, such as, for example, a body region to be examined.

In order to achieve more uniform excitation of the nuclear spins, gradient fields can be applied during the RF pulse in order to achieve spatial encoding of the $B_1$ field. Similarly to the k-space, which is scanned during the acquisition of MR data, this is also referred to as a transmission k-space, which is scanned during excitation of the nuclear spins. Herein, a stronger or longer application of the radio-frequency field $B_1$ can take place for the regions in which weaker signals are expected. The concept of the transmission k-space can be described mathematically as follows:

$$k(t) = -\gamma \int_t^T G(\tau) d\tau \quad (1)$$

wherein k is the position in the transmission k-space, T is the duration of the RF pulse and G is the gradient field applied at any time during the pulse. Herein, each point in the transmission k-space corresponds to a three-dimensional spatial frequency that describes the phase distribution of the (in particular transversal) magnetization. Magnetization excited at time t is shifted to a specific position in the transmission k-space by the gradients applied afterwards. This in particular means that the center of the transmission k-space is usually achieved at the end of the RF pulse, i.e., at time T.

Since relatively long transmit pulses are required when scanning the transmission k-space and this can result in high specific absorption rates (SARs), the principle of "parallel excitation" (pTx) is typically used; here a plurality (typically 8) of transmit antennas are used in order to excite the nuclear spins in the object under examination with radio-frequency radiation. An RF coil composed of a plurality of parallel transmit antennas that can be actuated in parallel and independently of one another can, for example, be a phased-array coil. The simultaneous actuation of a plurality of transmit antennas in the case of transmission k-space scans that take place simultaneously and/or between the actuations by actuating gradient coils is also referred to as a pTx pulse.

The article by M. A. Cloos, N. Boulant, et al.: "$k_T$-points: Short three-dimensional tailored RF pulses for flip-angle homogenization over an extended volume" Magn. Reson. Med. 2011, 67:72-80. doi:10.1002/mrm.22978 describes a pTx pulse of this kind with which a plurality of transmit antennas are actuated in parallel, wherein the transmission k-space is only scanned at certain points, which are referred to as $k_T$-points.

Therefore, energy is only applied at a few points in the transmission k-space, wherein short excitation pulses with specific amplitudes and phases are transmitted individually at each point on each transmit antenna. In order to move from one $k_T$-point to the next, the gradient fields are applied for a certain time ("gradient blips") during which no voltage is applied to the transmit antennas. EP 2 296 000 $B_1$ describes a similar method, wherein here the transmission k-space is scanned in straight sections called "spokes".

Shaihan Malik, S. J. Keihaninejad et al.: "Tailored excitation in 3D with spiral nonselective (SPINS) RF pulses". Magn. Reson. Med. 2012, 67: 1303-1315 demonstrates another possibility, namely continuous scanning of the transmission k-space along a so-called SPINS trajectory (SPINS: "spiral nonselective"), while RF energy is constantly applied/transmitted from the transmit antennas. It is defined in spherical coordinates and, in addition to linear courses of azimuth and polar angle for which only an angular velocity is given, the radial component is based on a Fermi function. It is very computationally intensive to optimize this trajectory and so it has to be set permanently beforehand.

SUMMARY AND DETAILED DESCRIPTION

The object is to provide a method for exciting nuclear spins with which particularly homogeneous excitation in the selected volume (the region of interest) within the object under examination and in particular a flip angle that is as uniform as possible can be achieved over the selected volume. Moreover, it is the object to provide a method for exciting nuclear spins that enables the most homogeneous excitation of nuclear spins possible, even in clinical practice, i.e., which does not require a computing time of, for example more than three minutes. Moreover, it is an object to provide a simple integrated solution for the ultrahigh field MRT in order to homogenize the flip angle distribution without requiring too much measurement time and computing time or technical knowledge on the part of the user.

The embodiments achieve this object with the method, a computer program, a non-transitory data carrier, and a magnetic resonance device. Preferred embodiments are disclosed in the subclaims. All advantages and features of the method are also applicable to the computer program and the magnetic resonance device and vice versa.

A method is provided for exciting nuclear spins in a region of interest in an object under examination by a radio-frequency pulse, wherein, during at least one phase of the radio-frequency pulse, RF excitation fields are transmitted while magnetic field gradients are simultaneously applied so that the magnetization of the nuclear spins moves on a trajectory through a transmission k-space. The trajectory moves in a first phase of the radio-frequency pulse at a radial distance around the center of the transmission k-space, wherein the radial distance corresponds to the radius of a sphere superimposed with at least one radial harmonic.

Therefore, an excitation pulse has a special trajectory in the transmission k-space (hereinafter also referred to as the k-space), which is particularly adaptable to any inhomogeneity patterns of the $B_1$ field. The trajectory is characterized by the fact that, in one phase of the radio-frequency pulse, it moves at a radial distance around the center of the transmission k-space, wherein the radial distance corresponds to the radius of a sphere superimposed with at least one radial harmonic. Therefore, the trajectory—with the deviations caused by the harmonics—in particular runs on a sphere around the center of the transmission k-space. This takes place in a first phase, wherein the first phase can be temporally located at the beginning of the entire RF pulse, but does not necessarily have to be. The radial harmonics are, in particular, a series of sine and cosine functions with a fundamental and one or more harmonics with an adjustable amplitude. Therefore, the harmonics are advantageously defined as sine and/or cosine oscillations of the radial component of the trajectory. The method is preferably computer-implemented and can in particular be executed on an MR device during the acquisition of MR signals, for example MR images for medical diagnostics. The method deflects the magnetization of the nuclear spins in the region of interest by a prespecified flip angle. In advantageous embodiments, the method is used at high $B_0$ field strengths of 3 to 12 tesla, preferably 5 to 10 tesla, for example in 7T devices.

It has been shown that this enables particularly homogeneous excitation of the nuclear spins to be achieved with simultaneously low SAR exposure. In simulations, an improved flip angle homogeneity was obtained with the same SAR exposure when using the trajectory according to this approach instead of the SPINS trajectory described by Malik et al. Herein, the flip angle homogeneity was established by a lower root-mean-square deviation of the actual flip angle from the target flip angle. Since the trajectory can advantageously (but not necessarily) be used for nonselective RF excitation pulses, it is also referred to as a SPENS trajectory ("spherical nonselective"). One advantage of the SPENS trajectory over the SPINS trajectory is the more precise adaptation to the inhomogeneity patterns of the excitation field and, in advantageous embodiments, of the trajectory radius (sphere radius) to the Larmor wavelength.

Preferably, there are more trajectory parameters and thus degrees of freedom for the trajectory design, which in turn include the possibility of exact adaptation to $B_1$ distributions, for example in patient heads.

In particular, during at least one phase of the radio-frequency pulse, RF excitation fields are transmitted while magnetic field gradients are simultaneously applied. Hence, the transmit antennas can be actuated simultaneously with the gradient coils. As a result, the magnetization moves on a trajectory through the transmission k-space, while simultaneously energy is applied to the spatial frequencies scanned with the trajectory. In the at least one phase, the trajectory is, in particular, continuous and preferably differentiable, i.e., it can be represented as a continuous line, in particular without kinks. Thus, the method fundamentally differs from the method described by M. A. Cloos et al., in which the nuclear spins are only excited at a few points or spokes in the transmission k-space. Moreover, there is an advantage over the $k_T$-point trajectory, in particular, in the higher number of degrees of freedom, since a plurality of k-space points are scanned and during this time a constantly variable excitation field is applied. As a result, this additionally enables a wide variety of pulse shapes (voltages applied to the transmit antennas). With a prespecified trajectory, these pulse shapes can be individually optimized by already established and efficient algorithms during the measurement after rapid mapping of the excitation magnetic fields and the main magnetic field, for example as described in the paper by J. Herrler, P. Liebig, R. Gumbrecht et al. "Fast online-customized (FOCUS) parallel transmission pulses: The combination of universal pulses and individual optimization", Magn. Reson. Med. 2021, 87: 3140-3154 (hereinafter: FOCUS-method).

The method is used to excite nuclear spins in a region of interest in an object under examination, wherein the region of interest can be a selected volume, for example a specific body region, a body part, such as, for example, the head, or also a smaller volume such as, for example, a slice, within the object under examination. The object under examination is for example a veterinary or human subject or patient. Preferably, the region of interest is in the head of a patient or includes the head.

The RF pulse is, in particular, nonselective, but may also be embodied as a selective pulse such that the region of interest is smaller than the entire region that can be excited by the RF coil used. The method can preferably be executed by a magnetic resonance device, as described in this case, wherein the RF pulse is, in particular, generated by an RF coil with one or more, in particular 2 to 16, preferably 4 to 8, typically 8, individual transmit antennas or channels.

The trajectory can advantageously be defined in spherical coordinates, i.e., with radial component, polar angle, and azimuth angle. The exact course of the trajectory and the amplitude and phase of the pulse voltages of the one or more RF transmit antennas at each point of the trajectory can, in particular, be optimized with a certain temporal resolution. The radial component can be defined differently in a plurality of, in particular, 2 to 5, preferably 3 to 4, phases in each case. On the other hand, in one embodiment, the courses of polar and azimuth angle can be defined with the same parameters over all phases of the RF pulse. For example, they can be defined with three parameters in each case, namely start angle, angular velocity and acceleration.

"Radio-frequency pulse", "RF pulse for short" means the entire excitation pulse with which the nuclear spins are excited, in particular deflected by a prespecified flip angle, and which, for example, lasts from time $t=0$ to time $t=T$. The RF pulse can be used in the context of any imaging sequence, i.e., for example in the context of a spin-echo, turbo-spin-echo, gradient-echo or echo-planar-imaging sequence.

In one embodiment, the trajectory and thus the signals with which the gradient coils are actuated and likewise the amplitudes and phases of the transmit antennas are described with certain parameters, wherein these parameters are then adapted individually for the $B_0$ field inhomogeneity and/or $B_1$ field inhomogeneity present during the examination. The trajectory can, for example, be described by 10 to 30, in particular 15 to 25, preferably 18, parameters. Moreover, the pulse shapes of the transmit antennas and a regularization parameter $\lambda$ can be adapted or optimized in each case, wherein $\lambda$ stands for a trade-off between optimal pulse shape and minimal SAR. In one embodiment, the parameters are preoptimized using maps of typical $B_0$ fields and $B_1$ fields in the examination region and are further individually optimized using $B_0$ maps and/or $B_1$ maps currently measured during the examination, for example as described in the paper by J. Herrler et al. with respect to the FOCUS method.

In the first phase, the trajectory moves at a radial distance, superimposed with at least one radial harmonic, around the center of the transmission k-space, wherein the radial distance corresponds to the radius of a sphere. Since the trajectory (with deviations due to the radial harmonics) moves on a sphere, it can be adapted particularly well to the inhomogeneity of an approximately circularly polarized $B_1$ field. As described here, the radius can be adapted or optimized, wherein this may have the result that, after optimization, the radius of the sphere approximately (i.e., +50%, in particular ±30%) corresponds to the inverse of the Larmor wavelength of the nuclear spins. This embodiment has the advantage that the $B_1$ inhomogeneities can be compensated particularly well, since they are primarily caused by the Larmor wavelength. Depending on the conductivity of different types of tissue in the object under examination, for example the human head, or reflection properties at interfaces between different organs or tissues, spatial waves form in some regions, in dependence on polar and azimuth angle, which deviate slightly from the actual Larmor wavelength. Therefore, in order to represent these inhomogeneity patterns in the transmission k-space and thus obtain the most suitable degrees of freedom for optimizing the pulse shapes of the transmit coils, a sphere is scanned in this embodiment. While different polar and azimuth angles are scanned, the superimposed radial harmonics, in particular sine and cosine oscillations of the radial component, can be used to set different radii for different angle combinations. It is possible to imagine a sphere with bumps or dents corresponding to the harmonics, which is scanned (in particular sparsely) in the transmission k-space.

Hence, the SPENS trajectory has the advantage over the SPINS trajectory that especially the trajectory radius can be adapted to the Larmor wavelength. Overall, there are preferably more trajectory parameters than with the SPINS trajectory and thus more degrees of freedom for the trajectory design, which in turn include the possibility of adapting exactly to $B_1$ distributions in patient heads.

According to one embodiment, the amplitude of the at least one radial harmonic is up to 30% of the radius of the sphere, preferably up to 20%, more preferably up to 15%. The number of harmonics is preferably 2 to 6, more preferably 3 to 5. Typically, the frequency of the radial harmonics and the number thereof is defined in advance, while their respective amplitude can be adjusted in dependence on polar and azimuth angle or optimized for a specific $B_1$ distribution.

In general, the parameters of the trajectory can be advantageously adjusted with the FOCUS optimization method, as described in the paper by J. Herrler, P. Liebig, R. Gumbrecht et al. "Fast online-customized (FOCUS) parallel transmission pulses: A combination of universal pulses and individual optimization", Magn. Reson. Med. 2021, 87: 3140-3154 or in patent application EP 3 809 151 A1. The optimization method described therein for adjusting parameters of a transmission trajectory of an RF pulse and the pulse shapes is herein referred to as the FOCUS method.

According to one advantageous embodiment, the radial harmonics contain a fundamental with a half wavelength corresponding to the length of the first phase and at least one further harmonic with a shorter wavelength, advantageously 1 to 5, more preferably 2 to 4, further harmonics with a halving wavelength in each case. Therefore, the fundamental is set such that a half wavelength is traversed during the first phase, i.e., a "bump" or a "dent" is passed, while the further harmonic(s) define smaller bumps or dents. This makes it particularly easy to take account of and compensate inhomogeneities that arise in the $B_1$ field, in particular due to a short Larmor wavelength.

According to one advantageous embodiment, in a second phase of the radio-frequency pulse, the trajectory moves on a continuous and in particular differentiable curve toward the center of the transmission k-space. Therefore, in particular, the second phase comprises a ramp in order to bring the radial component of the trajectory from the radius of the sphere to 0. In order not to exceed the increase in the gradient voltage permitted by the hardware, the course of the trajectory is continuous, i.e., does not break off, and is, in particular, differentiable, i.e., it does not have any "kinks". Rather, the trajectory preferably moves on a continuous curve toward the center of the transmission k-space so that the curve can be readily implemented by the existing gradient coils. In one advantageous embodiment, in a first half—i.e., up to the point where the radial component reaches half of the radius of the sphere—this curve comprises a parabola. In the second half of the second phase, this parabola is mirrored at its end point until the radial component has reached the value 0, i.e., up to the origin/center of the transmission k-space. Thus, at the end of the second phase, the desired magnitude of the radial component, in particular 0, and an increase close to 0 is achieved.

According to a preferred embodiment, during a third phase of the radio-frequency pulse, the trajectory remains in the center of the k-space. During this phase, in particular inhomogeneity patterns arise in the Larmor wavelength region as described above. However, in advantageous embodiments, these were at least largely compensated by the course of the trajectory in the first phase so that a very homogeneous flip angle distribution can be achieved at the end of the third phase.

In advantageous embodiments, the RF pulse comprises exactly these three phases, wherein their order can also be different than described in this case, in particular can be the other way round. In some embodiments, the second and/or third phase are different than described in this case, for example the second phase can be omitted if necessary and/or the third phase can also include a course of the trajectory outside the center of the k-space.

According to one advantageous embodiment, different azimuth and polar angles in the transmission k-space are scanned during the first and second phase of the radio-frequency pulse. Advantageously, in this case, the position in the transmission k-space is defined in spherical or polar coordinates. The course of the azimuth and polar angles can be adapted or optimized to existing $B_1$ inhomogeneities and $B_0$ inhomogeneities in order to achieve the most homogeneous flip angle distribution at the end of the RF pulse. According to one advantageous embodiment, the courses of polar and azimuth angle are in each case defined with 3 parameters: start angle, angular velocity and acceleration.

In advantageous embodiments, the radial component of the trajectory is in particular defined in three phases the relative length of which, based on the pulse duration, is again determined with two parameters ("phase transition positions"), wherein the relative length of the phases can also be adapted. In these three phases, the azimuth and polar angles can likewise be defined differently in each case. However, in advantageous embodiments, at least in the first and second phase of the RF pulse, the azimuth and polar angles are defined by the same parameters.

According to one advantageous embodiment, a plurality of radio-frequency transmit antennas are actuated in parallel during excitation; i.e., a pTx method is applied. Herein, an RF transmit coil with a plurality of channels or a plurality of transmit antennas, for example 2 to 16, advantageously 4 to 8, is used.

According to one embodiment, the trajectory can be defined as follows:

$$k_r(t) = \begin{cases} r_0 + \sum_{i=1}^{i=4}\left(a_i \sin\left(\frac{i\pi}{t_1}t\right) + b_i \cos\left(\frac{i\pi}{t_1}t\right)\right) & 0 \leq t \leq t_1 \\ r_0 - k_{ramp}(t - t_1) & t_1 \leq t \leq \frac{t_1 + t_2}{2} \\ k_{ramp}(t - t_2) & \frac{t_1 + t_2}{2} \leq t \leq t_2 \\ 0 & t_2 < t \leq T \end{cases} \quad (2)$$

1. $k_{ramp}(t) = 2r_0\left(\frac{t}{t_2 - t_1}\right)^2$ (3)

2. $k_\theta(t) = \theta_0 + \omega_\theta t + v_\theta t^2$ (4)

3. $k_\varphi(t) = \varphi_0 + \omega_\varphi t + v_\varphi t^2$ (5)

Formulas (2) to (5) represent an analytical description of the SPENS trajectory in k-space (unit:

$\left[\frac{1}{m}\right]$)

in spherical coordinates. Here, $k_r$ denotes the radial component of the trajectory, $k_\theta$ the azimuth angle of the trajectory and $k_\varphi$ the polar angle of the trajectory. As is evident, the radial component $k_r$ is in each case defined differently in four time periods, wherein the second and third period between $t_i$ and $t_2$ correspond to the second phase. The first phase lasts from time 0 up to time $t_1$ and the third phase lasts from time $t_2$ up to time T. Overall, the duration of the radio-frequency pulse is T. $r_0$ is the radius of the sphere on which the trajectory moves around the center of the transmission k-space in the first phase of the radio-frequency pulse. Therefore, in the first phase, the radial component is $r_0$, with the deviations established by the defined sine and cosine oscillations. In the example shown, four radial harmonics are defined, namely i=1 to i=4. In other embodiments only 2, 3, or up to 6 harmonics are defined. The harmonics are defined by a multiple of the frequency of the fundamental $1/2t_1$, and the harmonics in each case have amplitudes $a_i$ and $b_i$. The fundamental has the frequency $1/2t_i$ so that, in other words, their wavelength corresponds to twice the length of the first phase so the wavelength is equal to $2t_1/i$. The further harmonics in each case have a multiple of the fundamental frequency. The sine and cosine oscillations form bumps and dents on the sphere with the radius $r_0$, which is scanned by the trajectory.

The second phase is again divided into two parts of equal length, wherein the trajectory moves on a parabola in the first part and on a correspondingly mirrored parabola in the second part, as described above. In the third phase, the radial component of the trajectory is 0, i.e., the trajectory remains in the center of the transmission k-space.

The azimuth and polar components of the trajectory are in each case defined by three parameters which remain constant over the three phases, namely with a start angle $\theta_0$ or $\varphi_0$, an angular velocity $\omega_\theta$ and $\omega_\varphi$, and an angular trade-off $v_\theta$ and $v_\psi$. According to the above formulas, the trajectory is hence defined by a total of 18 parameters, namely $r_0$, $t_1$, $t_2$, T, $a_i$, and $b_i$ for i=1 to i=4 and the aforementioned 6 parameters of the polar and azimuth angles.

According to one advantageous embodiment, the parameters of the trajectory are, in particular, the radius of the sphere, the length of the first, second and/or third phase, and the amplitude of the radial harmonics. The parameters of the trajectory, in particular the radius of the sphere, the length of the first, second and/or third phase and the amplitude of the radial harmonics are optimized on the basis of field distribution maps of the region of interest, in particular a $B_0$ map and/or at least one $B_1$ map, in order to achieve excitation of the nuclear spins over the region of interest that is as uniform as possible. According to one advantageous embodiment, the parameters of the trajectory are the parameters listed in the above formulas.

Preferably, the parameters of the trajectory are adjusted or optimized according to the FOCUS method, wherein preferably a regularization parameter $\lambda$ is simultaneously optimized, wherein this parameter stands for a trade-off between the optimal pulse shape and minimal SAR. Optionally, the voltages applied to the RF transmit antenna(s) can also be optimized. The optimization is preferably initially universally precalibrated. For example, the $B_0$ field distributions and $B_1$ field distributions in the MR device are measured during a number of 1 to 50, preferably 5 to 20, examinations of an object under examination, for example the head of different subjects, and the FOCUS method is performed with these maps in order to obtain already preoptimized parameters of the trajectory and, if necessary, also pulse shapes for one or more RF transmit antennas. This preoptimization is performed outside the clinical routine and can therefore also require a longer computing time of, for example, up to several hours. When the actual examination takes place, for example, on the patient, the parameters preoptimized in this way can now only be slightly optimized individually on the basis of the currently measured $B_0$ field distributions and $B_1$ field distributions. This calculation can advantageously be performed within up to 3 minutes, preferably in up to 2 minutes, more preferably in up to 1 minute. A computing time of longer than 3 minutes is not considered acceptable in routine clinical practice. Preferably, the time of optimization after mapping of $B_0$ and $B_1$ field distributions is less than 30 seconds, preferably 2 to 20 seconds.

A computer program is provided for a control facility of a magnetic resonance device, wherein the computer program contains an actuation sequence for actuating the magnetic resonance device for capturing magnetic resonance data from an object under examination, wherein the actuation sequence contains control signals for magnet field gradients and transmit signals for one or more radio-frequency transmit antennas. When the computer program is performed, the actuation sequence causes the magnetic resonance device to perform the method. The computer program can, in particular, be performed on any magnetic resonance device intended for clinical practice. A computer program product contains a computer program according to the method.

Furthermore, the computer program or computer program product can be stored on a non-transitory computer-readable data carrier. This can, for example, be a hard disk, a server, a cloud server, a USB stick, an optical data carrier such as, for example, a CD-ROM or any other data carrier that permits permanent storage of digital data.

Finally, a magnetic resonance device is configured to perform the method. Such a magnetic resonance device has the usual components of a clinical MRT device, i.e., a main magnet for generating a $B_0$ field, gradient coils and an RF coil, which can have one or more separately actuatable transmit antennas, a console computer for controlling the magnetic resonance device and corresponding actuating electronics including frequency generators, amplifiers, D/A converters, etc.

BRIEF DESCRIPTION OF THE DRAWINGS

The invention will now be described in more detail with reference to exemplary embodiments and with reference to the accompanying drawings. The drawings show.

DETAILED DESCRIPTION OF THE PREFERRED EMBODIMENTS

Figure 1:
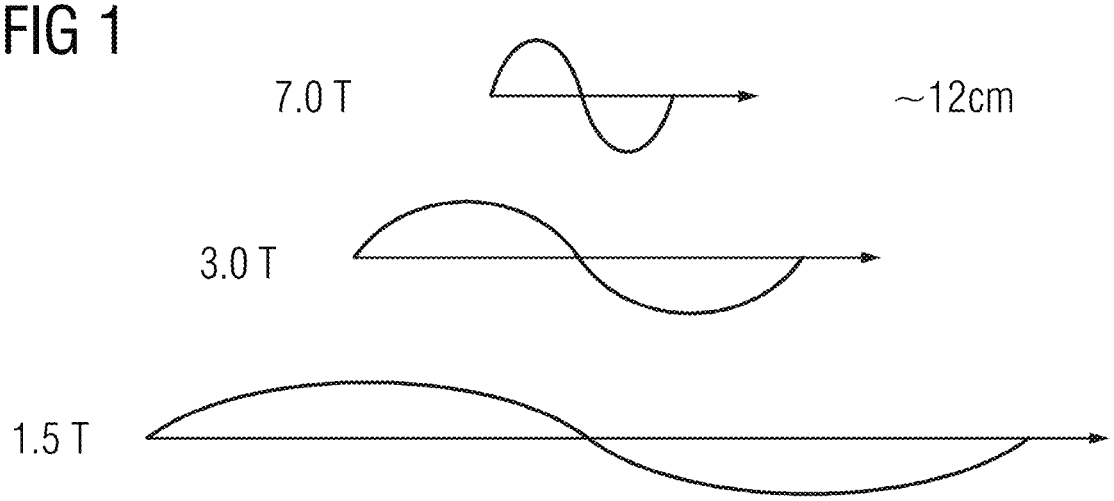
FIG. 1 an example schematic representation of the Larmor wavelength at different magnetic field strengths.

FIG. 1 illustrates how greatly the Larmor wavelength is reduced when the $B_0$ field strength increases from 1.5 tesla to 7.0 tesla: at 7.0 tesla, the Larmor wavelength is only approximately 12 cm, resulting in a $B_1$ inhomogeneity in the tissue.

Figure 2:
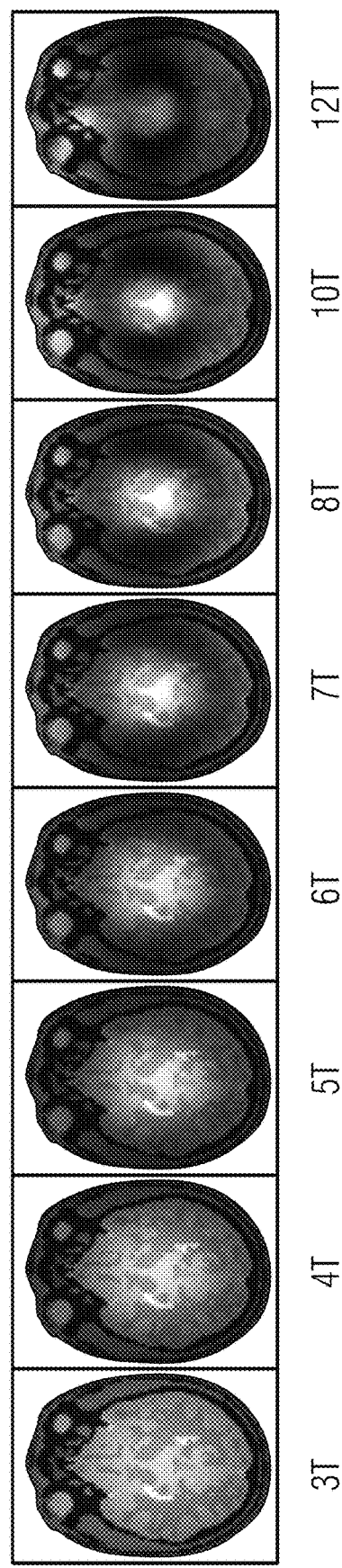
FIG. 2 shows examples of $B_1$ inhomogeneities in a human head at different $B_0$ field strengths.

This is illustrated in FIG. 2 with reference to a simulation of an axial section through a human skull: at 3 tesla, the brain still appears uniformly illuminated. At 5 tesla, it is already clearly visible that a darker ring develops about a still bright core in which the tissue is less well illuminated, i.e., for example a smaller flip angle was realized than in the center. This darker ring becomes darker and narrower as the field strength $B_0$ increases, until, at 12 tesla, there is clearly very poor illumination of the brain.

Figure 3:
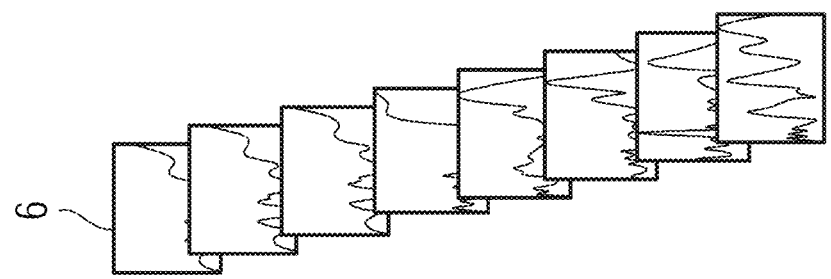
FIG. 3 illustrates a schematic representation of the different components that are measured or optimized for a pTx pulse, according to one embodiment.
Figure 3:
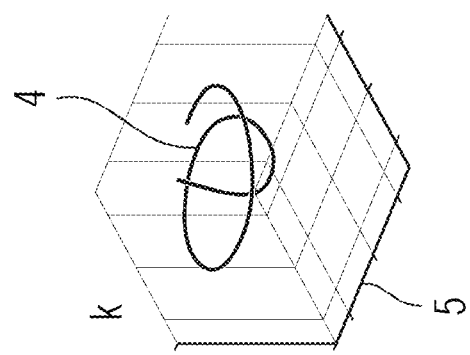
Figure 3:
Figure 3:
Figure 3:
Figure 3:
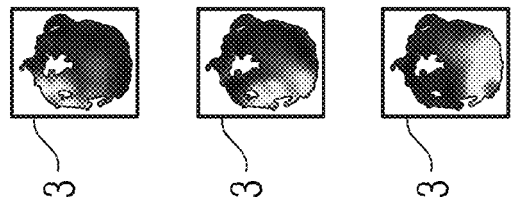

As described, this problem can be mitigated by using optimized pTx pulses. The components required for this are schematically illustrated in FIG. 3. In order to optimally adjust the pTx pulses to the field inhomogeneities present in each case, these methods, on the one hand, use a map 2 of the $B_0$ field, i.e., knowledge of the $B_0$ inhomogeneities in the object under examination. Furthermore, in order to be able to optimally actuate the parallel transmit antennas, their respective illumination field 3 are known, i.e., the so-called $B_1$ maps. In the example depicted, an RF coil with 8 parallel transmit antennas is used, the individual $B_1$ maps of which can be seen at 3. The $B_0$ and $B_1$ maps can be measured—both universally or averaged over a plurality of different subjects, or currently during an examination on a specific subject. This information can be used to optimize a trajectory 4 in the transmission k-space 5, such as, for example, the trajectory according to the embodiments. Advantageously, the trajectory is described generally by a plurality of parameters, and these parameters are then adapted to the current $B_0$ and $B_1$ maps in each case. Moreover, the pulse shapes 6, also called pulse profiles, can also be adapted, i.e., the voltages that are applied to the respective RF transmit antennas 3. Therefore, there are exactly as many pulse profiles 6 to be optimized as there are transmit antennas with a corresponding $b_1$ map 3. mathematically, the relationships of a dynamic pTx pulse can be depicted as follows:

$$i\gamma|\Sigma_{c=1}^{c=8} S_c(r) \cdot \int_0^T e^{i(-\Delta\omega_0(r)+rk(t))(T-t)} \cdot u_c(t) dt| = \alpha(r,T) \qquad (6)$$

Here, $S_c(r)$ denotes the $B_1$ field of the respective transmit antenna c, $\Delta\omega_0$ is the deviation of the $B_0$ field from the mean value $B_0$, and $u_c$ denotes the voltage applied to the respective transmit antenna. $\alpha$ denotes the flip angle reached at the respective position r.

Figure 4:
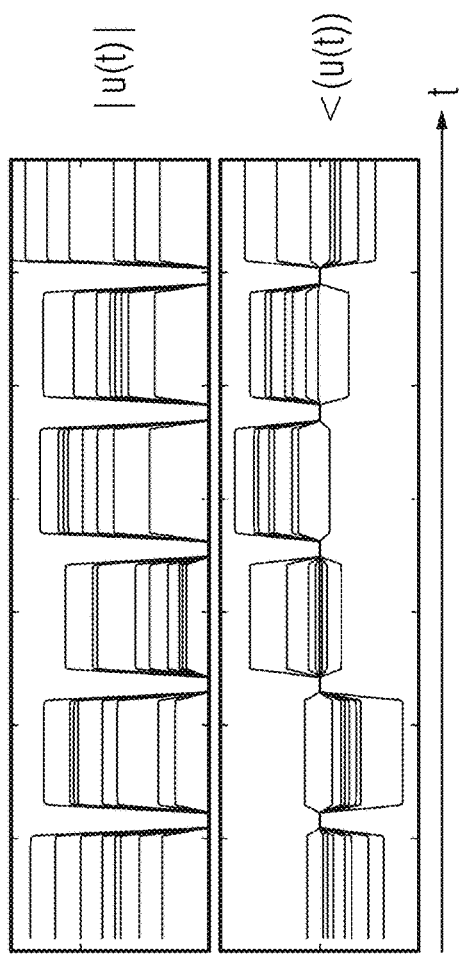
FIG. 4 shows an example of the course of the trajectory and RF pulse shapes for the $k_T$-points method.
Figure 4:
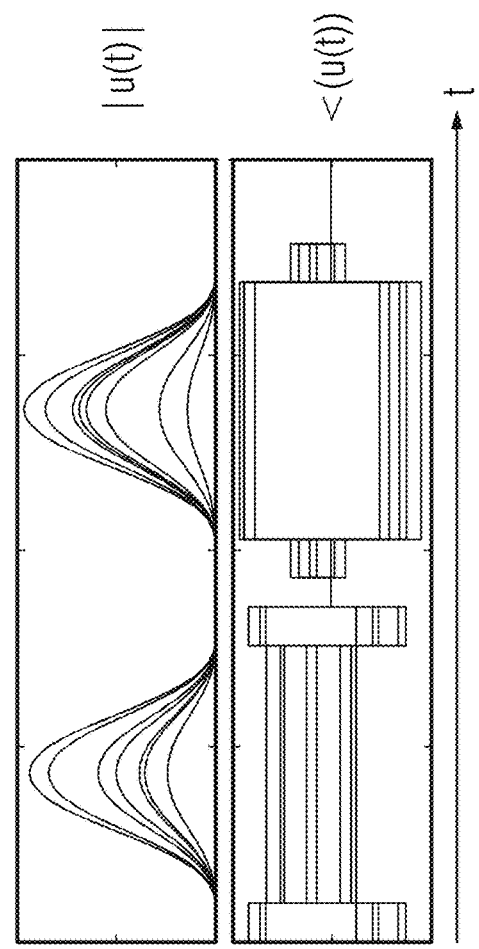
Figure 4:
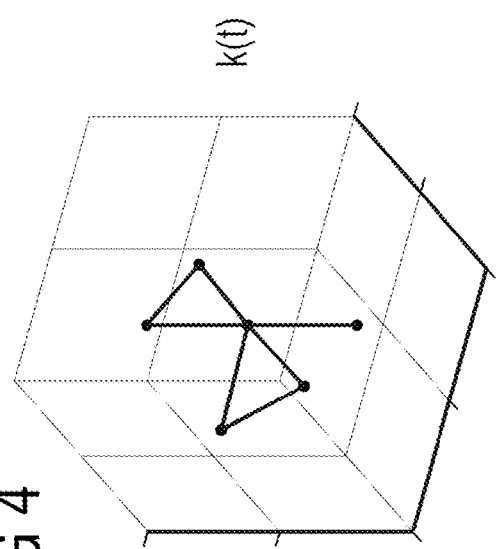
Figure 5:
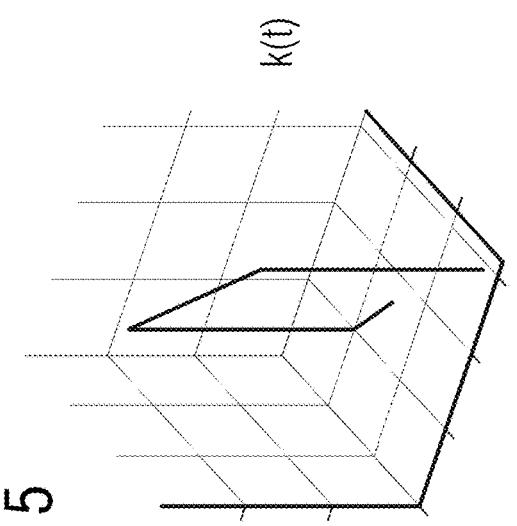
FIG. 5 shows an example of the course of the trajectory and the RF pulse shapes for the spokes method.
Figure 6:
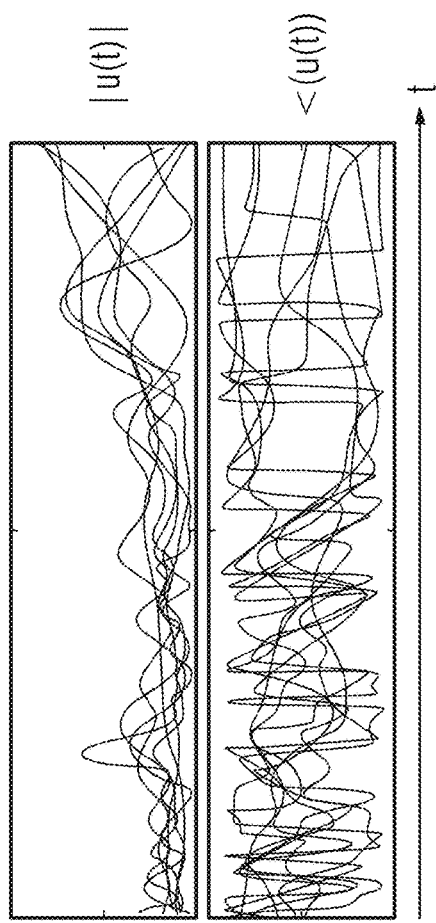
FIG. 6 shows an example of the course of the trajectory and the RF pulse shapes for a SPINS trajectory.
Figure 6:
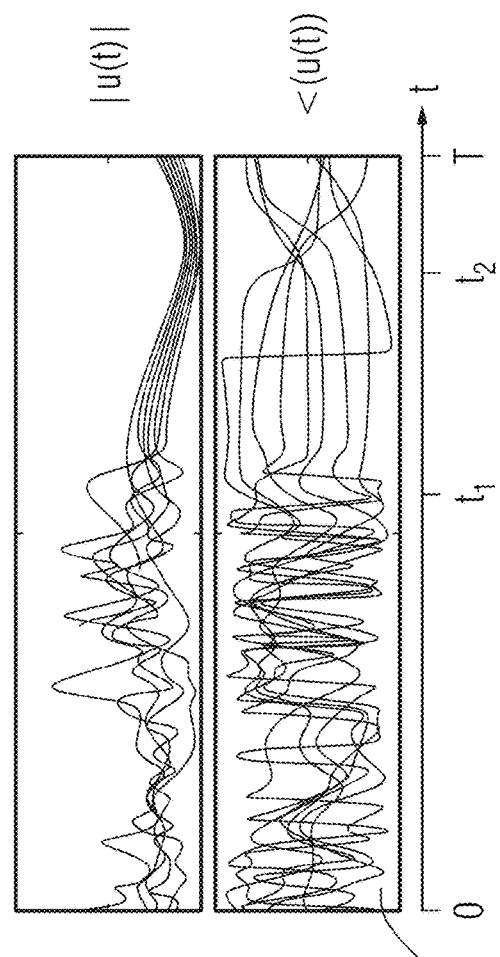

Various trajectory courses known from the prior art, (in each case on the left) and the associated RF pulse profiles or voltages applied to the plurality of transmit antennas (in each case on the right) are depicted in FIGS. 4 to 6 and compared with the trajectory according to the present approach in FIG. 7. |u(t)| in each case denotes the magnitude of the voltages applied to the RF transmit antennas; <(u(t)) depicted below describes the phase.

FIG. 4 depicts the $k_T$ trajectory in which in each case square-wave voltages u are applied to the different transmit antennas (indicated by different shades of gray in the right-hand side of the figure).

In contrast, FIG. 5 depicts the spokes method according to EP 2 296 000 $B_1$ in which the k-space is scanned in the form of "spokes", i.e., in straight trajectory sections, as depicted on the lefthand side of FIG. 5.

Figure 7:
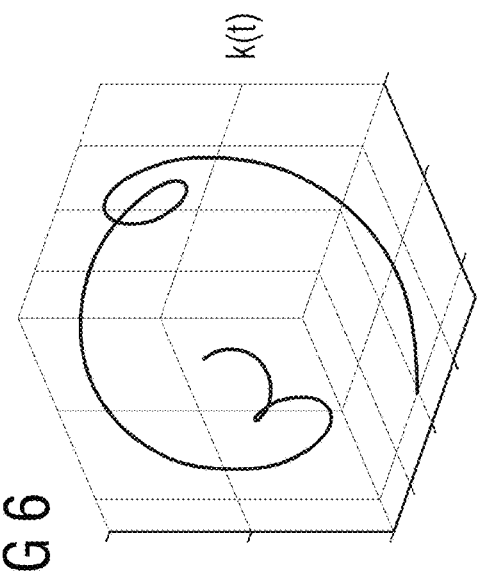
FIG. 7 shows an example of the course of the trajectory and the RF pulse shapes for a SPENS trajectory.
Figure 7:
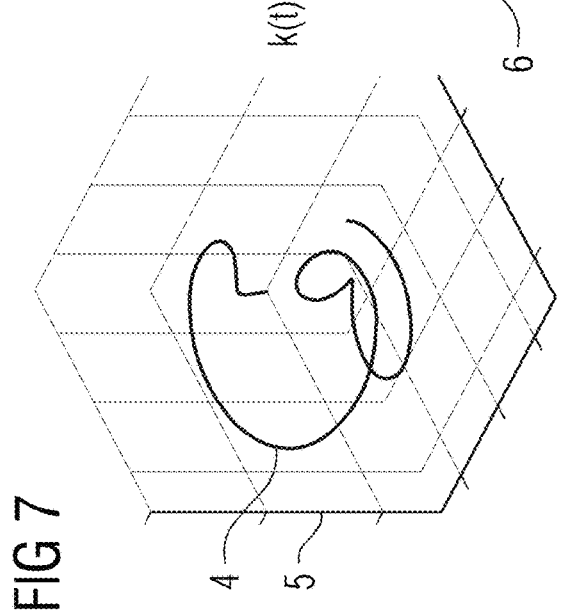

FIG. 6 illustrates the SPINS trajectory, while FIG. 7 depicts the SPENS trajectory. In this three-dimensional representation of the k-space 5, the course of the trajectory 4 cannot be optimally identified and so reference is made to FIGS. 8 and 9 in this regard. On the righthand side of FIG. 7, it can be identified in the case of the RF pulses that initially different voltages are applied to all RF transmit antennas with relatively strong deflections. This characterizes the first phase up to time $t_1$. This is followed by rather smoother courses of the voltages corresponding to the ramp to the k-space center in the second phase. Also, in the third phase after $t_2$ until T, the voltages only have a steady change. In this phase, no more gradients are applied, instead the magnetization remains in the center of the k-space.

Figure 8:
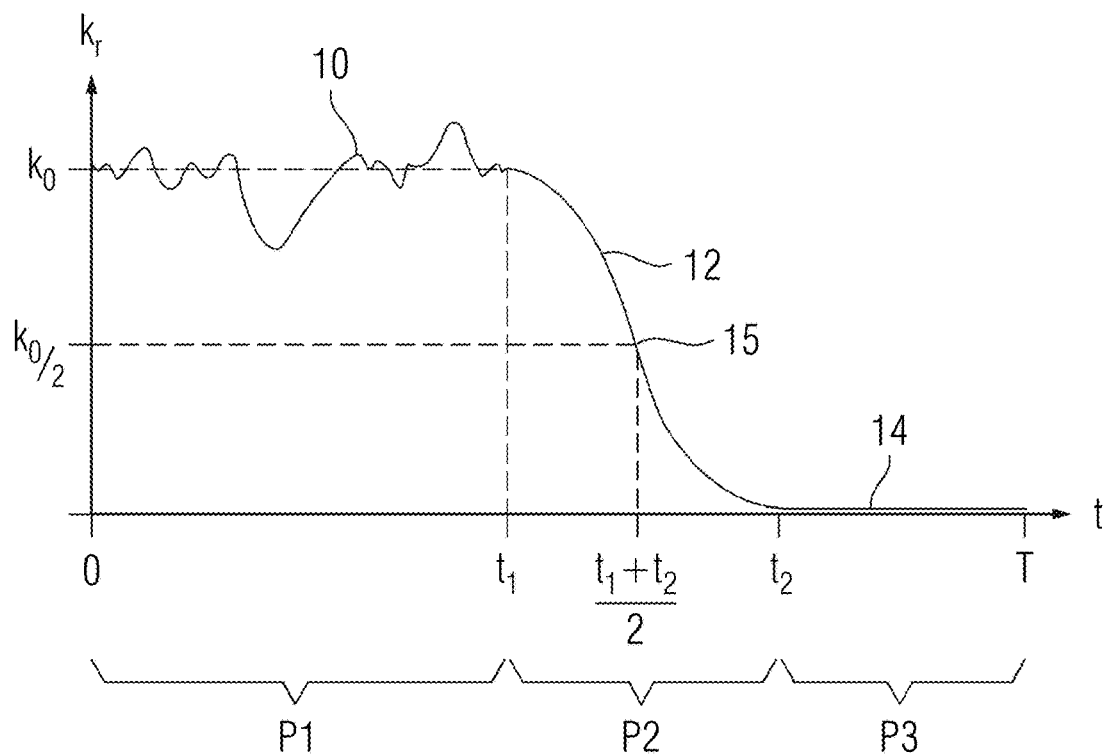
FIG. 8 is an example graph of the radial trajectory component during the RF pulse.

FIG. 8 illustrates the three phases of the RF pulse by the radial component $k_r$ of the k-space trajectory: in the first phase P1, which lasts from time 0 to $t_1$, the trajectory 10 runs approximately at the level of the radius of the sphere $k_0$, but superimposed by various harmonics. At the time $t_1$, it starts to run toward 0 in the form of an inverted parabola 12, wherein this parabola 12 is mirrored at point 15 halfway through the second phase P2 and then arrives at the end of the second phase P2 at time $t_2$. Here, the trajectory 14 remains during the third phase P3 until time T.

Figure 9:
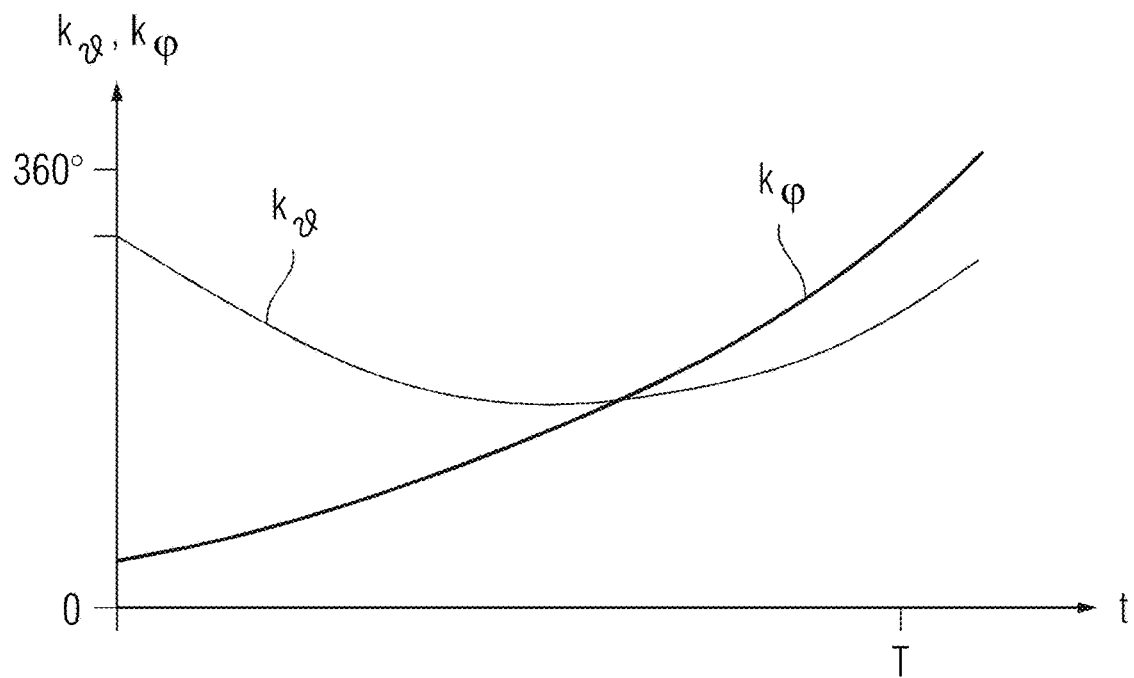
FIG. 9 illustrates examples of the azimuth and polar components of the trajectory during the RF pulse.

The azimuth and polar angles $k_\theta$ or $k_\varphi$ are depicted in FIG. 9 and have a continuous and differentiable course over all three phases up to time T, which can be described by a quadratic formula. Obviously, another analytical description that is not quadratic is also conceivable.

Figure 10:
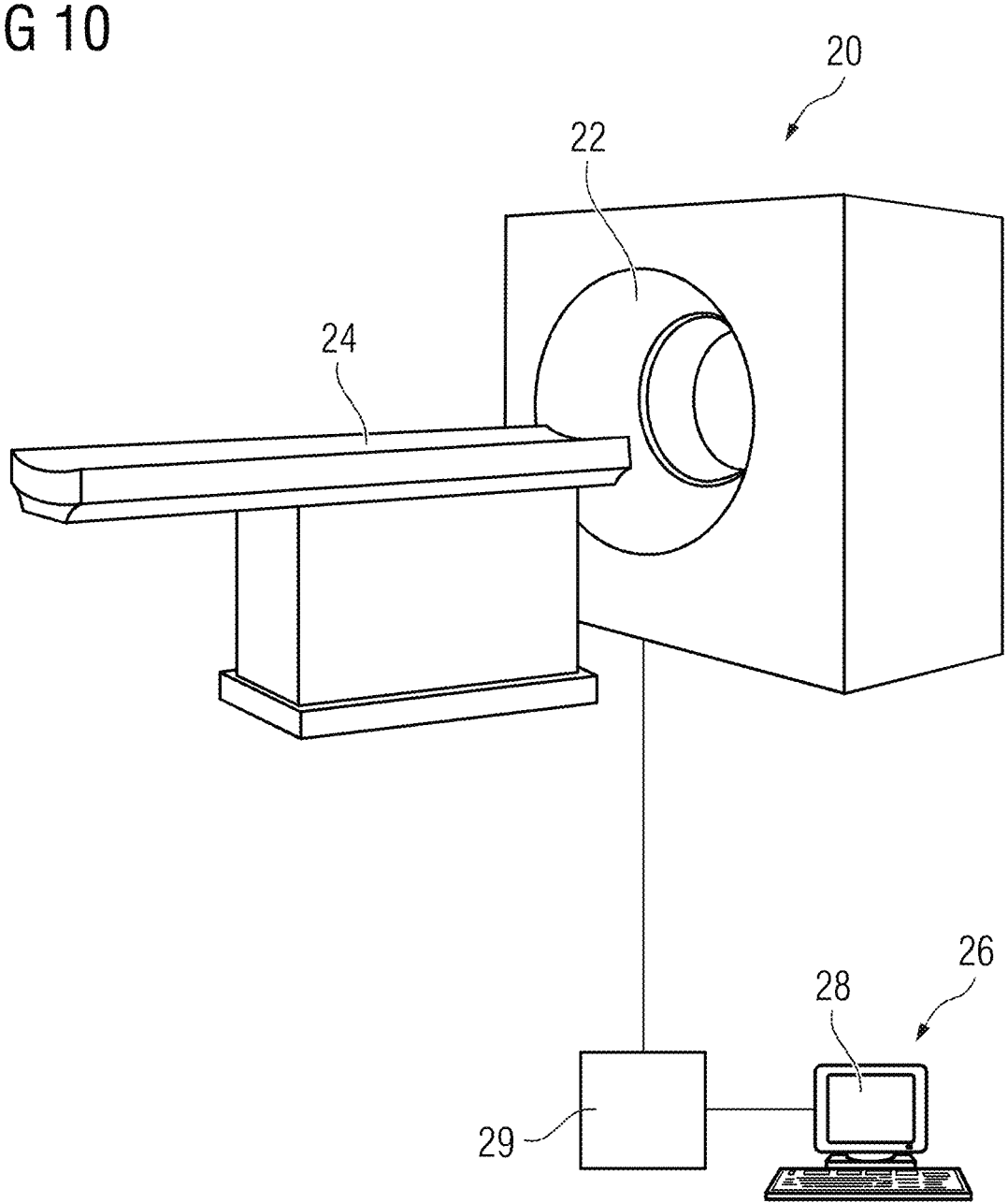
FIG. 10 is a schematic representation of a magnetic resonance device according to one embodiment.

Finally, FIG. 10 shows a magnetic resonance device 20 with which the method can be executed. The device has a $B_0$ magnet under the housing that surrounds an examination region 22 into which an object under examination can be moved on a bench 24. The device can, for example, be controlled by a computer 26 with a screen 28 and hard disk 29 (memory or non-transitory computer readable storage medium) and further computing units. The computer program can be stored on the hard disk 29.

It is intended that the foregoing description be regarded as illustrative rather than limiting, and that it be understood that all equivalents and/or combinations of embodiments are intended to be included in this description.

It is to be understood that the elements and features recited in the appended claims may be combined in different ways to produce new claims that likewise fall within the scope of the present invention. Thus, whereas the dependent claims appended below depend from only a single independent or dependent claim, it is to be understood that these dependent claims can, alternatively, be made to depend in the alternative from any preceding or following claim, whether independent or dependent, and that such new combinations are to be understood as forming a part of the present specification.

The invention claimed is:

1. A method for exciting nuclear spins in a region of interest in an object under examination by a radio-frequency pulse, the method comprising:
during at least one phase of the radio-frequency pulse, excitation fields are transmitted while magnetic field gradients are simultaneously applied so that the magnetization of the nuclear spins moves on a trajectory through a transmission k-space,
wherein, in a first phase of the at least one phase of the radio-frequency pulse, the trajectory moves at a radial distance around a center of the transmission k-space, wherein the radial distance corresponds to a radius of a sphere superimposed with at least one radial harmonic,
wherein, in a second phase of the at least one phase of the radio-frequency pulse, the trajectory moves on a continuous curve toward the center of the transmission k-space.

2. A method for exciting nuclear spins in a region of interest in an object under examination by a radio-frequency pulse, the method comprising:
during at least one phase of the radio-frequency pulse, excitation fields are transmitted while magnetic field gradients are simultaneously applied so that the magnetization of the nuclear spins moves on a trajectory through a transmission k-space,
wherein, in a first phase of the at least one phase of the radio-frequency pulse, the trajectory moves at a radial distance around a center of the transmission k-space, wherein the radial distance corresponds to a radius of a sphere superimposed with at least one radial harmonic,
wherein different azimuth and polar angles are scanned, during the first phase and a second phase of the at least one phase of the radio-frequency pulse.

3. A method for exciting nuclear spins in a region of interest in an object under examination by a radio-frequency pulse, the method comprising:
during at least one phase of the radio-frequency pulse, excitation fields are transmitted while magnetic field gradients are simultaneously applied so that the magnetization of the nuclear spins moves on a trajectory through a transmission k-space,
wherein, in a first phase of the at least one phase of the radio-frequency pulse, the trajectory moves at a radial distance around a center of the transmission k-space, wherein the radial distance corresponds to a radius of a sphere superimposed with at least one radial harmonic,
wherein parameters of the trajectory are optimized on a basis of field distribution maps of the region of interest.

4. The method as claimed in claim 1, wherein the amplitude of the at least one radial harmonic is up to 30% of the radius of the sphere.

5. The method as claimed in claim 1, wherein the radial harmonics contain a fundamental with a half wavelength corresponding to the length of the first phase and at least one further harmonic with a shorter wavelength.

6. The method as claims in claim 1 wherein the continuous curve comprises a differentiable curve.

7. The method as claimed in claim 1, wherein, during a third phase of the at least one phase of the radio-frequency pulse, the trajectory remains in the center of the transmission k-space.

8. The method as claimed in claim 1, wherein a plurality of radio-frequency coils are actuated in parallel during transmission of the excitation fields.

9. The method as claimed in claim 3, wherein the optimization is for uniformity of the excitation of the nuclear spins over the region of interest.

10. The method as claimed in claim 3, wherein the parameters of the trajectory comprise the radius of the sphere, a length of the first phase, a second phase, and/or a third phase of the at least one phase, and an amplitude of the at least one radial harmonic, and wherein the field distribution maps comprise a $B_0$ map and/or at least one $B_1$ map.

11. The method as claimed in claim 1, wherein, during a third phase of the at least one phase of the radio-frequency pulse, the trajectory remains in the center of the transmission k-space.

12. The method as claimed in claim 4, wherein the radial harmonics contain a fundamental with a half wavelength corresponding to the length of the first phase and at least one further harmonic with a shorter wavelength.

13. The method as claimed in claim 11, wherein different azimuth and polar angles are scanned, during the first phase and the second phase of the at least one phase of the radio-frequency pulse.

14. The method as claimed in claim 13, wherein a plurality of radio-frequency coils are actuated in parallel during transmission of the excitation fields.

15. The method as claimed in claim 14, wherein parameters of the trajectory are optimized on a basis of field distribution maps of the region of interest.

* * * * *